United States Patent
Yap et al.

(10) Patent No.: US 9,123,685 B2
(45) Date of Patent: Sep. 1, 2015

(54) MICROELECTRONIC PACKAGES HAVING FRONTSIDE THERMAL CONTACTS AND METHODS FOR THE FABRICATION THEREOF

(71) Applicants: Weng Foong Yap, Phoenix, AZ (US); Douglas G. Mitchell, Tempe, AZ (US)

(72) Inventors: Weng Foong Yap, Phoenix, AZ (US); Douglas G. Mitchell, Tempe, AZ (US)

(73) Assignee: FREESCALE SEMICONDUCTOR INC., Austin, TX (US)

( * ) Notice: Subject to any disclaimer, the term of this patent is extended or adjusted under 35 U.S.C. 154(b) by 117 days.

(21) Appl. No.: 13/942,518

(22) Filed: Jul. 15, 2013

(65) Prior Publication Data

US 2015/0014838 A1   Jan. 15, 2015

(51) Int. Cl.
*H01L 21/00* (2006.01)
*H01L 23/367* (2006.01)
*H01L 23/31* (2006.01)
*H01L 21/56* (2006.01)
*H01L 23/00* (2006.01)
*H01L 23/538* (2006.01)

(52) U.S. Cl.
CPC .......... *H01L 23/367* (2013.01); *H01L 23/3677* (2013.01); *H01L 24/14* (2013.01); *H01L 24/96* (2013.01); *H01L 21/561* (2013.01); *H01L 23/3121* (2013.01); *H01L 23/5386* (2013.01); *H01L 23/5389* (2013.01); *H01L 24/05* (2013.01); *H01L 24/13* (2013.01); *H01L 2224/02375* (2013.01); *H01L 2224/0401* (2013.01); *H01L 2224/04105* (2013.01); *H01L 2224/05548* (2013.01); *H01L 2224/05552* (2013.01); *H01L 2224/12105* (2013.01); *H01L 2224/131* (2013.01); *H01L 2224/13022* (2013.01); *H01L 2224/17519* (2013.01)

(58) Field of Classification Search
CPC ... H01L 23/147; H01L 23/055; H01L 21/683; H01L 24/25; H01L 21/18; H01I 23/055
USPC .................................................... 438/12, 122
See application file for complete search history.

(56) References Cited

U.S. PATENT DOCUMENTS

| | | | |
|---|---|---|---|
| 8,039,315 B2 | 10/2011 | Lee et al. | |
| 8,217,511 B2 | 7/2012 | Tracht et al. | |
| 8,283,768 B2 | 10/2012 | Kang et al. | |
| 2006/0131735 A1* | 6/2006 | Ong et al. | 257/706 |
| 2013/0105982 A1* | 5/2013 | Jin et al. | 257/773 |

* cited by examiner

*Primary Examiner* — Caridad Everhart
(74) *Attorney, Agent, or Firm* — Ingrassia Fisher & Lorenz, P.C.

(57) ABSTRACT

Microelectronic packages and methods for fabricating microelectronic packages are provided. In one embodiment, the method includes forming one or more redistribution layers over an encapsulated die having a frontside bond pad area and a frontside passivated non-bond pad area. The redistribution layers are formed to have a frontside opening over the non-bond pad area of the encapsulated die. A primary heat sink body is provided in the frontside opening and thermally coupled to the encapsulated die. A contact array is formed over the redistribution layers and is electrically coupled to a plurality bond pads located on the frontside bond pad area of the encapsulated die.

20 Claims, 10 Drawing Sheets

20 ⇘

22 — Obtain semiconductor die having frontside bond pad areas and frontside non-bond pad areas 36 — Encapsulate semiconductor die in molded panel using, for example, redistributed chip packaging (RCP) process 44 — Build redistribution layers including frontside openings over frontside non-bond pad areas of encapulated die 66 — Provide central heat sink bodies in frontside openings in thermal contact with encapsulated die (e.g., plate metal layers or attach metal slugs); form dielectric layer over bodies, if desired 72 — Form contact array over package frontside; form thermally-conductive contacts in contact with central heat sink bodies if covered by dielectric layer 76 — Singulate panel to produce completed RCP packages having frontside thermal contacts

FIG. 1

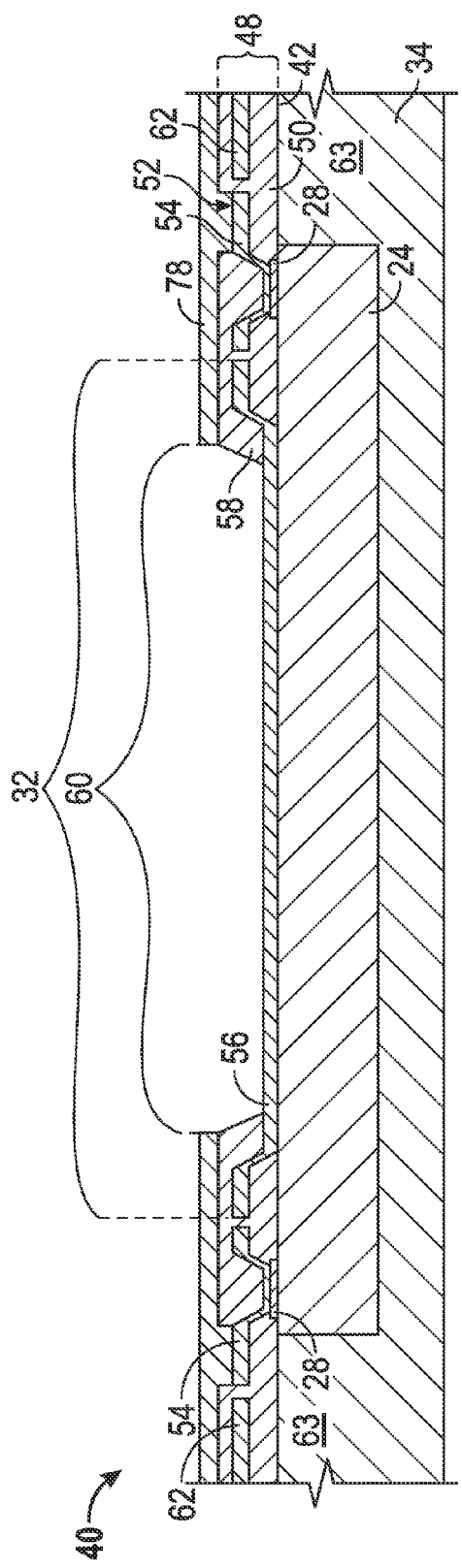
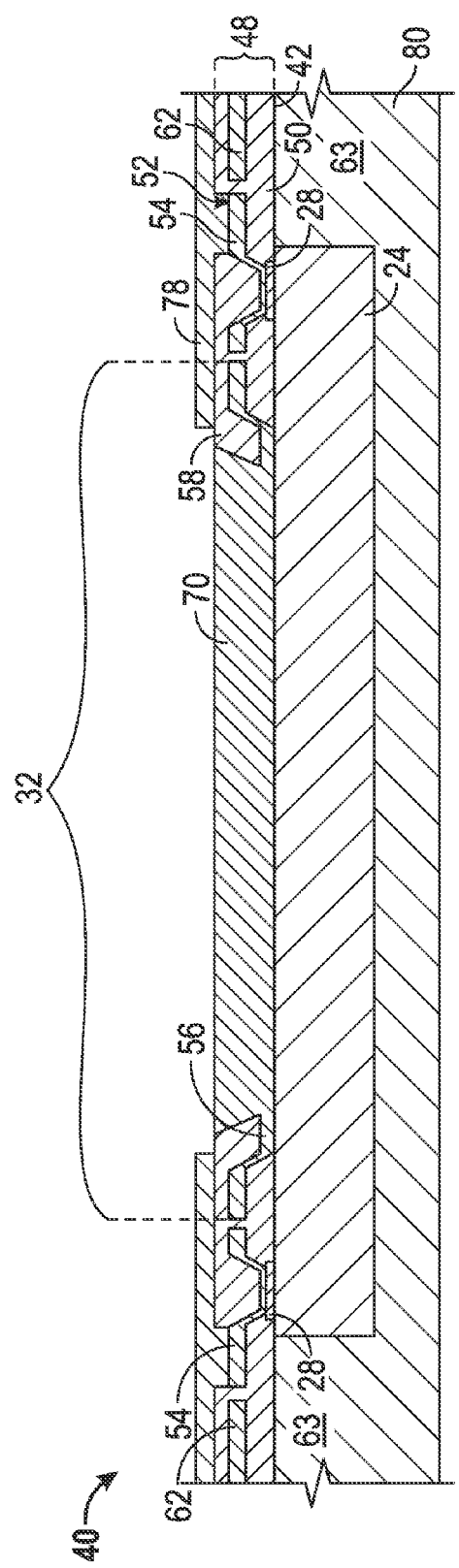
FIG. 7
FIG. 8

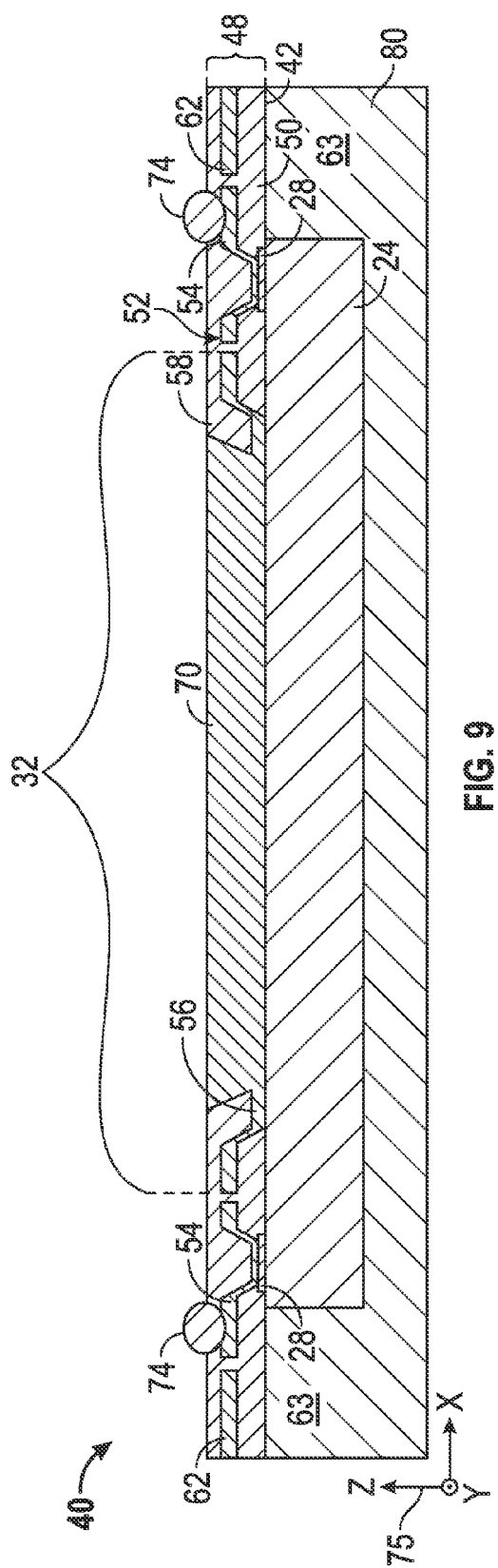
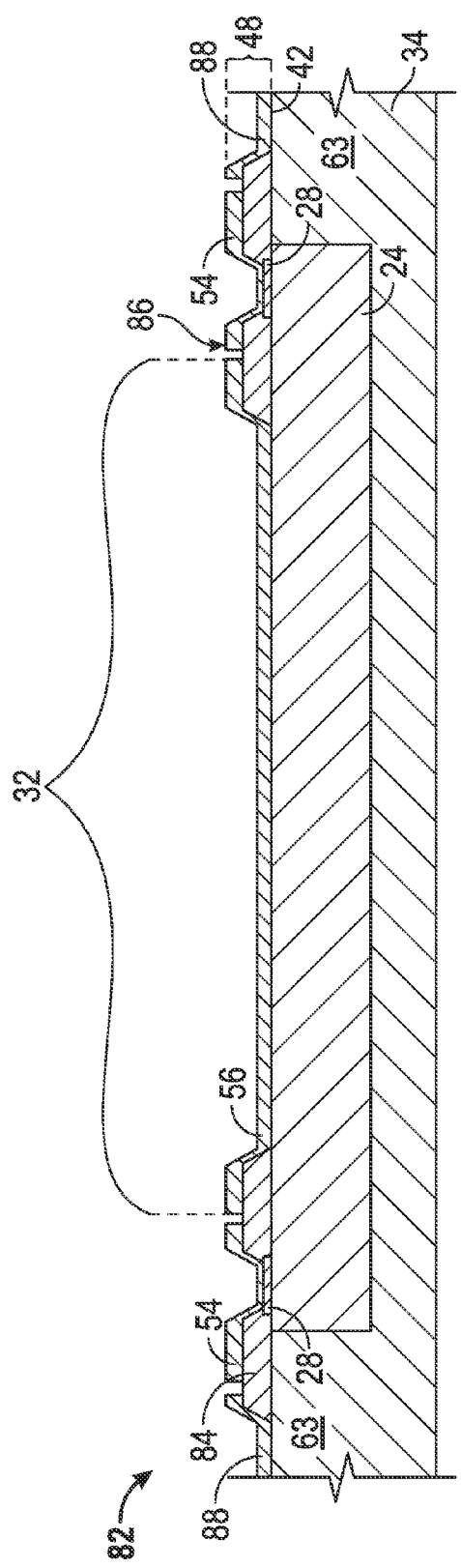
FIG. 9
FIG. 10

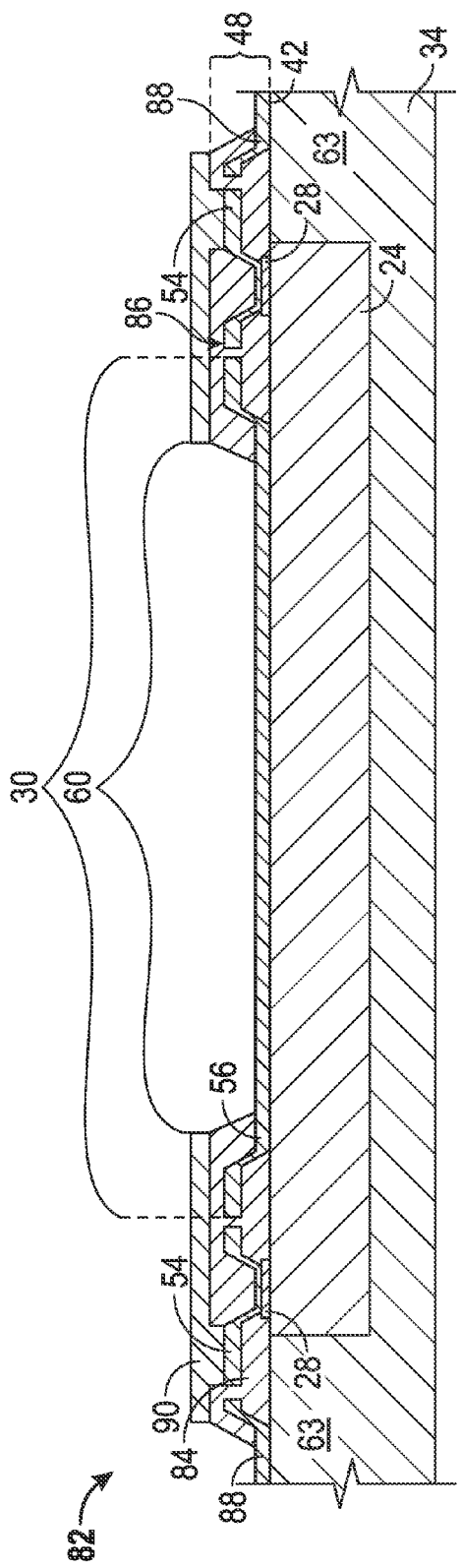
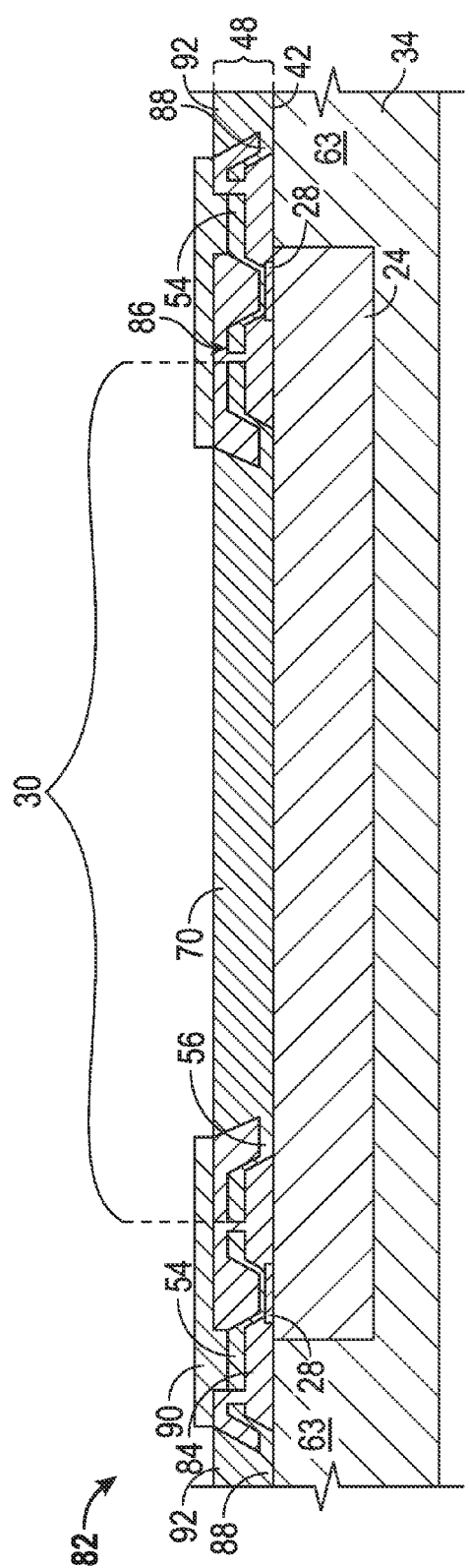
FIG. 11
FIG. 12

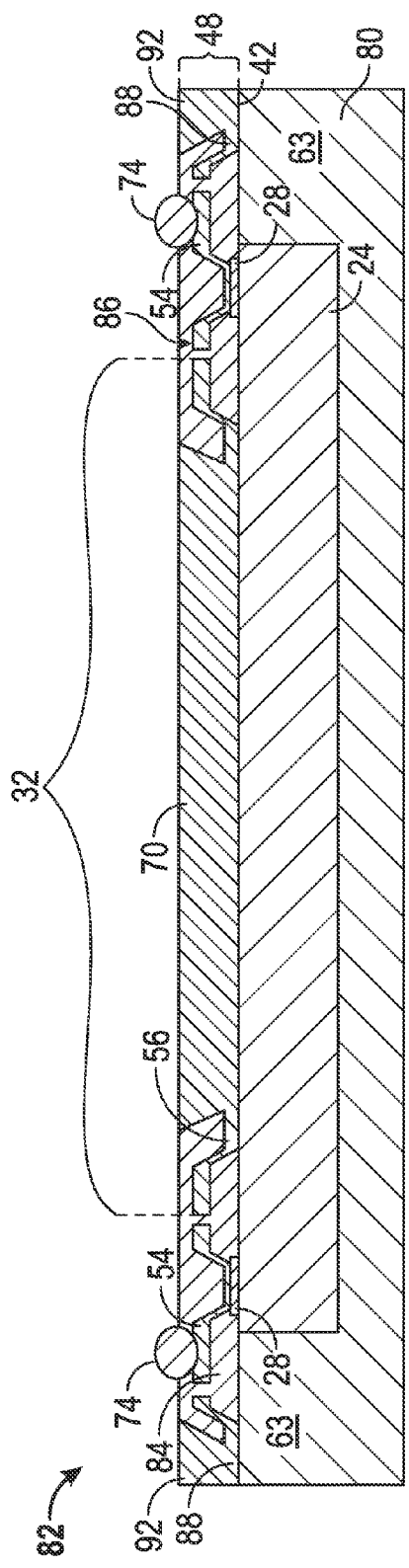
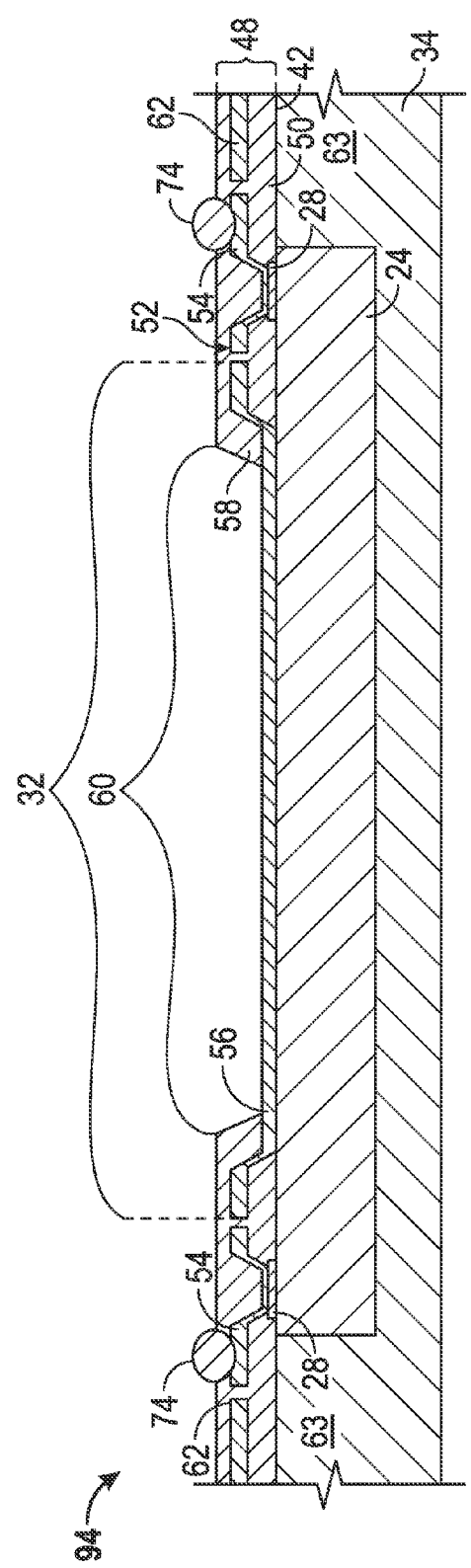

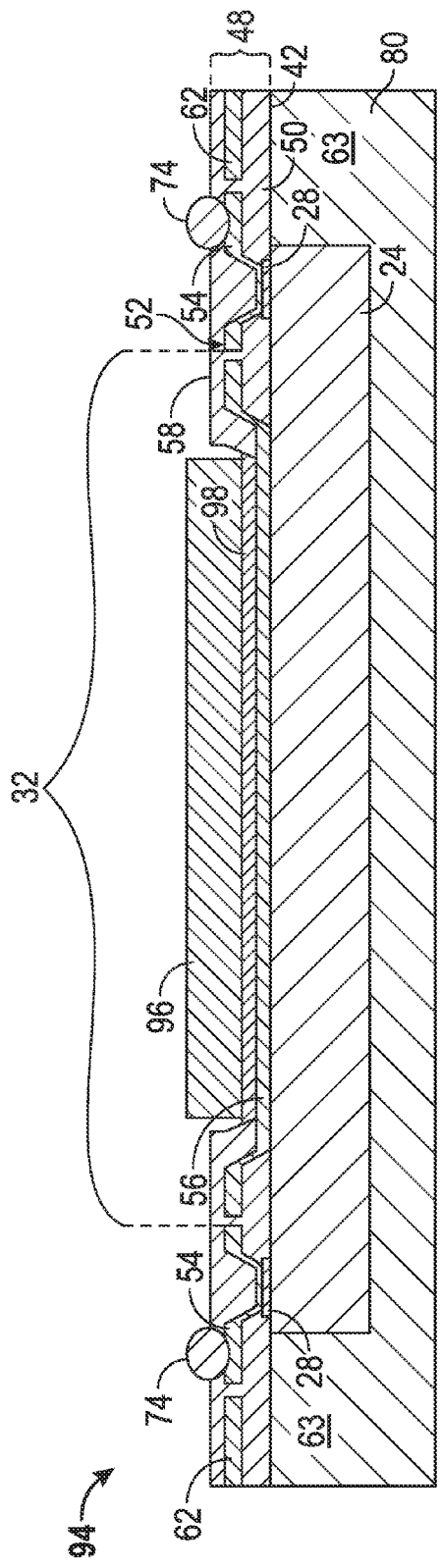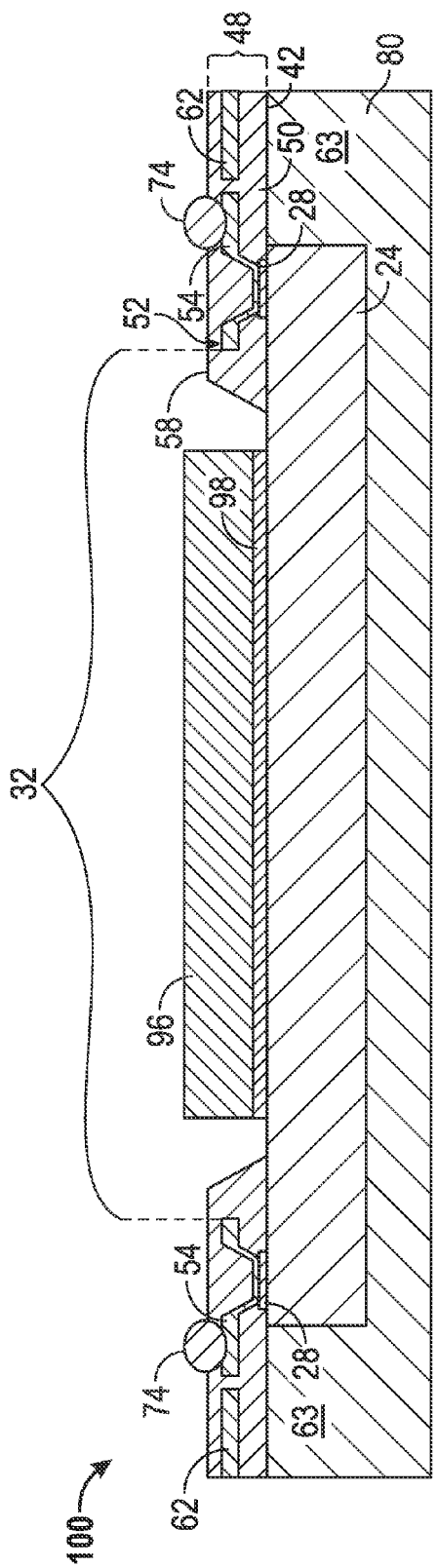

MICROELECTRONIC PACKAGES HAVING FRONTSIDE THERMAL CONTACTS AND METHODS FOR THE FABRICATION THEREOF

TECHNICAL FIELD

Embodiments of the present invention relate generally to microelectronic packaging and, more particularly, to microelectronic packages and methods for fabricating microelectronic packages having frontside thermal contacts.

BACKGROUND

High performance semiconductor die can generate excess heat during operation. Efficient heat dissipation may thus be important to ensure proper functioning of the die. In instances wherein a semiconductor die is encapsulated within a surrounding dielectric material, such as when the semiconductor die is contained within a Redistributed Chip Package (RCP package) or other Fan-Out Wafer Level Package, heat dissipation from the semiconductor die may be reduced by the surrounding encapsulant, which is typically formed from a dielectric material having a relatively low thermal conductivity. The thermal performance of an RCP package can be improved by attaching a copper slug having planform dimensions equal to the RCP package to package backside. The encapsulated die may be exposed through the package backside prior to attachment of the copper slug, in which case the slug may be placed in direct contact with the backside of the die. Alternatively, a relatively thin layer of encapsulant may be provided between the die and the copper slug to ease the RCP package fabrication process, albeit with a reduction in the thermal conductivity of the heat dissipation path extending from the encapsulated die to the externally-exposed backside slug.

BRIEF DESCRIPTION OF THE DRAWINGS

At least one example of the present invention will hereinafter be described in conjunction with the following figures, wherein like numerals denote like elements, and:

FIG. 1 is a flowchart illustrating a method for fabricating an RCP package including one or more frontside thermal contacts, as illustrated in accordance with an exemplary and non-limiting embodiment of the present invention; and FIGS. 2-18 illustrate several different RCP packages at various stages of manufacture and produced in accordance with the exemplary fabrication method shown in FIG. 1.

Figure 2:
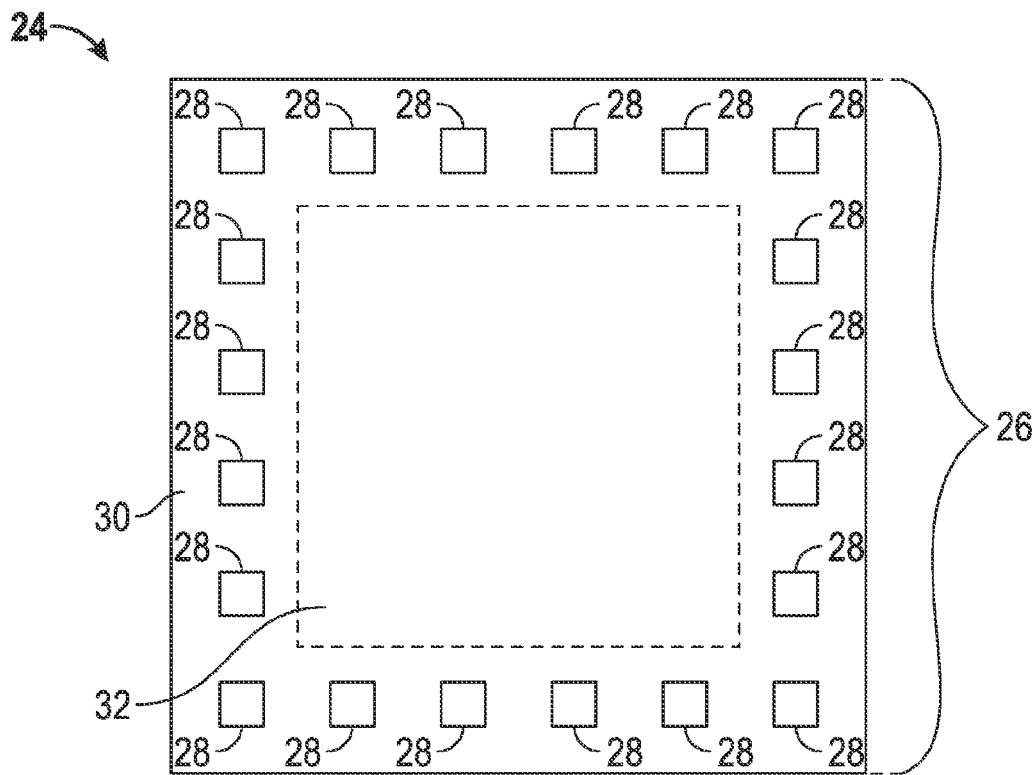

For simplicity and clarity of illustration, the drawing figures illustrate the general manner of construction, and descriptions and details of well-known features and techniques may be omitted to avoid unnecessarily obscuring the exemplary and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

The following Detailed Description is merely exemplary in nature and is not intended to limit the invention or the application and uses of the invention. Any implementation described herein as exemplary is not necessarily to be construed as preferred or advantageous over other implementations. Furthermore, there is no intention to be bound by any theory presented in the preceding Background or the following Detailed Description.

Terms such as "first," "second," "third," "fourth," and the like, if appearing in the description and the subsequent claims, may be utilized to distinguish between similar elements and are not necessarily used to indicate a particular sequential or chronological order. Such terms may thus be used interchangeably and that embodiments of the invention are capable of operation in sequences other than those illustrated or otherwise described herein. Furthermore, terms such as "comprise," "include," "have," and the like are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as appearing herein, is defined as directly or indirectly connected in an electrical or non-electrical manner. Furthermore, the terms "substantial" and "substantially" are utilized to indicate that a particular feature or condition is sufficient to accomplish a stated purpose in a practical manner and that minor imperfections or variations, if any, are not significant for the stated purpose. Finally, as still further appearing herein, terms such as "over," "under," "on," and the like are utilized to indicate relative position between two structural elements or layers and not necessarily to denote physical contact between structural elements or layers. Thus, a first structure or layer may be described as fabricated "over" or "on" a second structure, layer, or substrate without indicating that the first structure or layer necessarily contacts the second structure, layer, or substrate due to, for example, presence of one or more intervening layers.

As appearing herein, the term "metal," as appearing herein, encompasses both highly pure metals and alloys containing at least one metal in addition to other metallic or non-metallic constituents. In this regard, a named metal is defined to include highly pure metals, as well as alloys containing the named metal as a primary constituent; e.g., the term "copper" may be used to encompass both highly pure copper, as well as copper-based alloys. The term "thermally-conductive," as appearing herein, is utilized to describe a material having a thermal conductivity exceeding 0.5 watts per meter kelvin; more preferably, exceeding about 100 watts per meter kelvin; and, still more preferably, exceeding about 300 watts per meter kelvin. Furthermore, the phrase "in thermal contact" encompasses direct physical contact between two named elements (e.g., the frontside of a semiconductor die and an overlying heat sink body, as described below) allowing heat transfer therebetween, as well as indirect thermal contact between two named elements creating a heat transfer path therebetween extending through one or more intervening thermally-conductive layers, members, or structures, such as an intervening layer of metal or thermally-conductive epoxy. The term "frontside thermal contact" is utilized herein to denote a thermally-conductive body exposed through the frontside of a microelectronic package, such as a Redistributed Chip Package (RCP package). Finally, the term "interconnect lines" is utilized to refer to electrically-conductive paths or routing, which may include any combination of electrically-conductive (e.g., metal) traces, plugs, vias, and the like.

FIG. 1 is a flowchart setting-forth a method 20 for producing a number of microelectronic or RCP packages having frontside thermal contacts, which provide efficient thermal conduction paths from semiconductor die encapsulated within the package to the package's exterior for improved heat dissipation of during operation of the packaged die. As shown in FIG. 1 and described in detail below, method 20 is offered by way of non-limiting example only. It is emphasized that the fabrication steps shown in FIG. 1 can be performed in alternative orders, that certain steps may be omitted, and that additional steps may be performed in alternative embodiments. Furthermore, various steps in the manufacture of microelectronic packages and the semiconductor die or other microelectronic components included therein (e.g., microelectronic device panels produced using Redistributed Chip Packaging techniques generally) are well-known and, in the interests of brevity, will only be mentioned briefly herein or will be omitted entirely without providing the well-known process details. While described below in conjunction with the manufacture of several different exemplary RCP packages, as illustrated at various stages of completion in FIGS. 2-18, it will be appreciated that exemplary method 20 can be utilized to produce various other types of RCP packages.

Exemplary method 20 commences with the production of a plurality of semiconductor die (STEP 22, FIG. 1). The semiconductor die may be independently fabricated during STEP 22 or obtained from a supplier. The semiconductor die are conveniently produced utilizing well-known wafer level processing techniques to produce one or more integrated circuits on each die. In addition, each die is fabricated to include a number of frontside bond pads, which provide points-of-contact to the integrated circuits formed thereon. FIG. 2 is a top-down view of a semiconductor die 24 that may be produce or otherwise obtained during STEP 22 of exemplary method 20. Semiconductor die 24 has an upper surface or frontside 26 over which a number of bond pads 28 have been formed. Frontside 26 is divided into two general regions or areas: (i) a frontside bond pad area 30 over which bond pads 28 are dispersed, and (ii) a frontside non-bond pad area 32 lacking any bond pads thereover. An upper dielectric layer, such as a capping or passivation layer, may further be formed over the topside of semiconductor die 24 through which bond pads 28 extend. For example, in some embodiments, an upper dielectric layer may be formed over the entire frontside surface (i.e., bond pad area 30 and non-bond pad area 32 with the exclusion of bond pads 28) for passivation and/or electrical insulation purposes. Alternatively, an upper passivation or other dielectric layer may be formed solely over non-bond pad area 32 of die 24. By forming such a passivation or dielectric layer over non-bond pad area 32, electrical shorting is prevented between the circuitry carried by die 24 and any electrically-conductive layer or member subsequently placed in direct contact with non-bond pad area 32, such as thermally-conductive base layer 56 described below in conjunction with FIGS. 4-14, 17, and 18 or heat sink body 96/epoxy 98 (if electrically conductive) described below in conjunction with FIGS. 15 and 16.

As indicated in FIG. 2, frontside non-bond pad area 32 is preferably located in a central region of semiconductor die 24. By comparison, frontside non-bond pad area 32 is preferably located on an outer peripheral portion of semiconductor die 24 and, more preferably, extends around the outer perimeter of die 24 to circumscribe frontside bond pad area 30 in the embodiment shown. The planform dimensions of frontside non-bond pad area 32 are preferably maximized as compared to the planform dimensions of die 24 to maximize the area available for heat dissipation, while allotting sufficient room for the disposition and adequate spacing of bond pads 28 within frontside bond pad area 30. For example, frontside non-bond pad area 32 may have a length and width that is at least quarter and, preferably, at least three-fourths the length and width of semiconductor die 24, respectively. This example notwithstanding, the planform shape, dimensions, and location of non-bond pad area 32 may vary amongst embodiments. Additionally, die 24 may be fabricated to include multiple non-bond pad areas in further embodiments.

Figure 3:
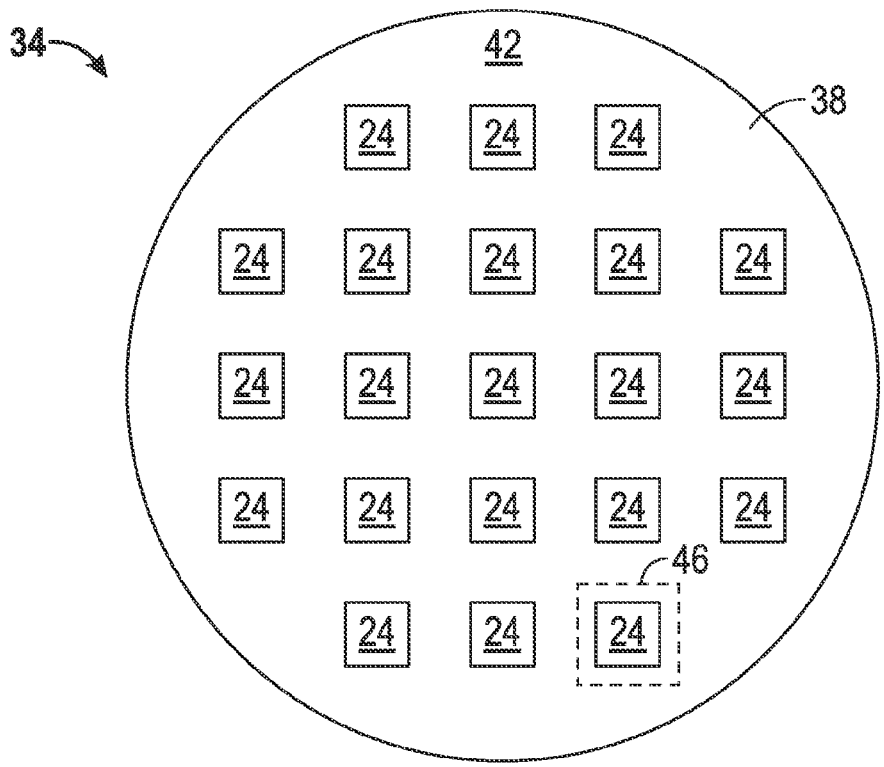

Exemplary method 20 continues with the production of a Redistribute Chip Packaging (RCP) panel containing an array of semiconductor die (STEP 36, FIG. 1). FIG. 3 is a top-down view of an RCP panel 34 that may be produced during STEP 36 of exemplary method 20 (FIG. 1). For the purposes of explanation, the semiconductor die embedded within RCP panel 34 are considered to be substantially identical to semiconductor die 24 (FIG. 2) and have consequently each been identified in FIG. 3 by reference numeral "24." It will be appreciated, however, that the semiconductor die embedded within RCP panel 34 need not be identical and may vary in shape, dimensions, and/or layout in further embodiments. RCP panel 34 includes an RCP panel body 38 in which semiconductor die 24 are embedded. Die 24 are exposed through major surface 42 of panel body 38 (referred to herein as "frontside surface 42") at this juncture in the fabrication process, but will subsequently be covered by one or more additional layers of material, as described below in conjunction with FIGS. 4-9. In the illustrated exemplary embodiment, RCP panel 34 includes twenty one square-shaped die 24 arranged in a grid pattern or array; however, the number of microelectronic devices, the planform dimensions of the die, and the manner in which die are spatially distributed within panel body 38 may vary amongst embodiments. Panel body 38 is conveniently produced as a relatively thin, disc-shaped body or mass having a generally circular planform geometry; however, panel body 38 can be fabricated to have any desired dimensions and planform shape, such as a rectangular shape.

By way of non-limiting example, one process suitable for fabricating RCP panel 34 may be performed as follows. First, semiconductor die 24 are distributed in a desired spatial arrangement over the upper surface of a temporary substrate, such as a layer of adhesive tape. If desired, one more release layers may also be applied or otherwise formed over the carrier's supper surface prior to positioning of the die. A mold frame, which has a central cavity or opening therethrough, is positioned over the temporary substrate and around the array of semiconductor die 24 utilizing a pick-and-place tool. A dielectric mold compound or encapsulant, such as a silica-filled epoxy, is then dispensed into the cavity of the mold frame and flows over semiconductor die 24. Sufficient volume of the encapsulant is typically dispensed over semiconductor die 24 to enable the encapsulant to flow over the backside or non-contact-bearing surfaces of die 24. The encapsulant may then be solidified by, for example, an oven cure to yield a solid panel body in which semiconductor die 24 are embedded. The panel body may be rigid or flexible, depending upon the chosen encapsulant. The panel body is then released from the temporary substrate to reveal the frontside 42 of panel body 38 through which die 24 are exposed. If desired, the front side of the panel body may be ground or polished to bring RCP panel 34 to a desired thickness prior to release of the panel body from the carrier. In further embodiments, a ground plane may also be formed and encapsulated in the molded RCP panel. The foregoing example notwithstanding, panel body 38 can be produced utilizing various other known fabrication techniques including, for example, compression molding and lamination processes.

Figure 4:
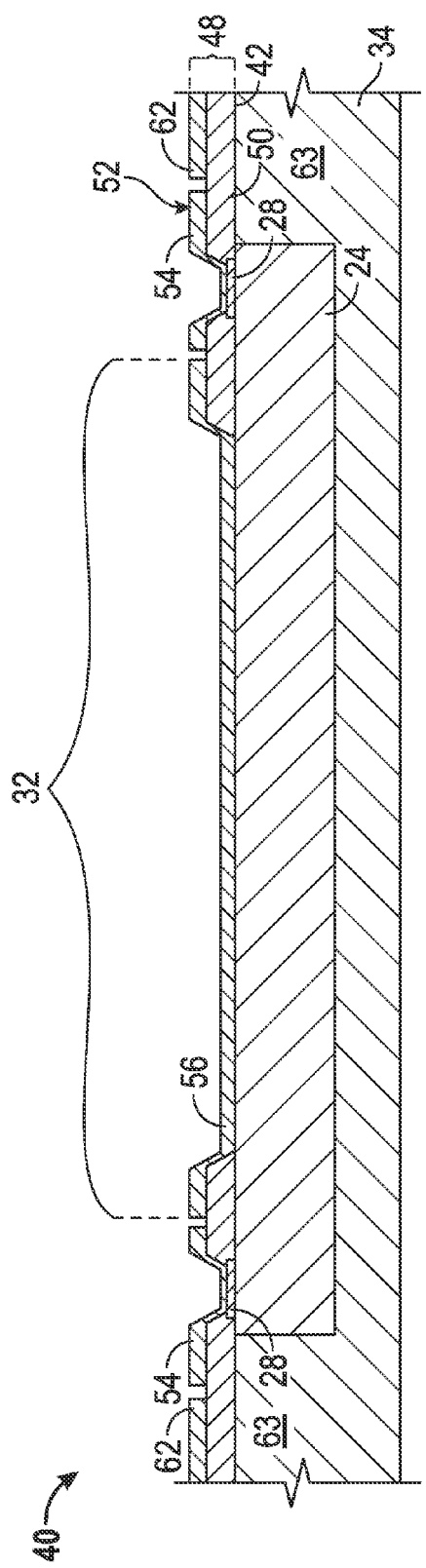
Figure 5:
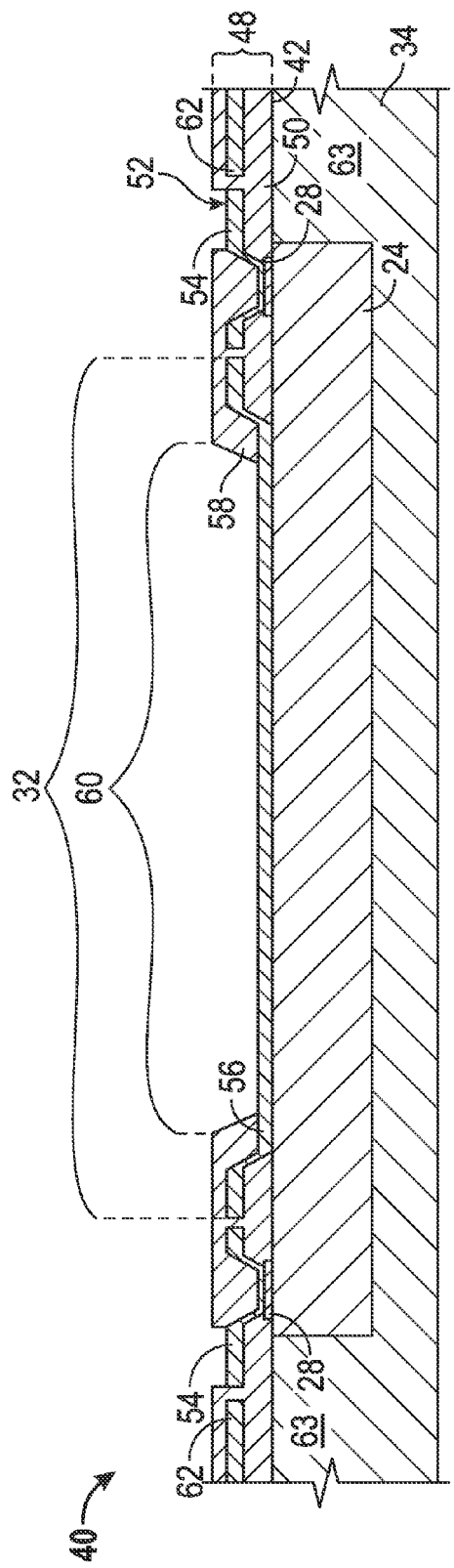
Figure 6:
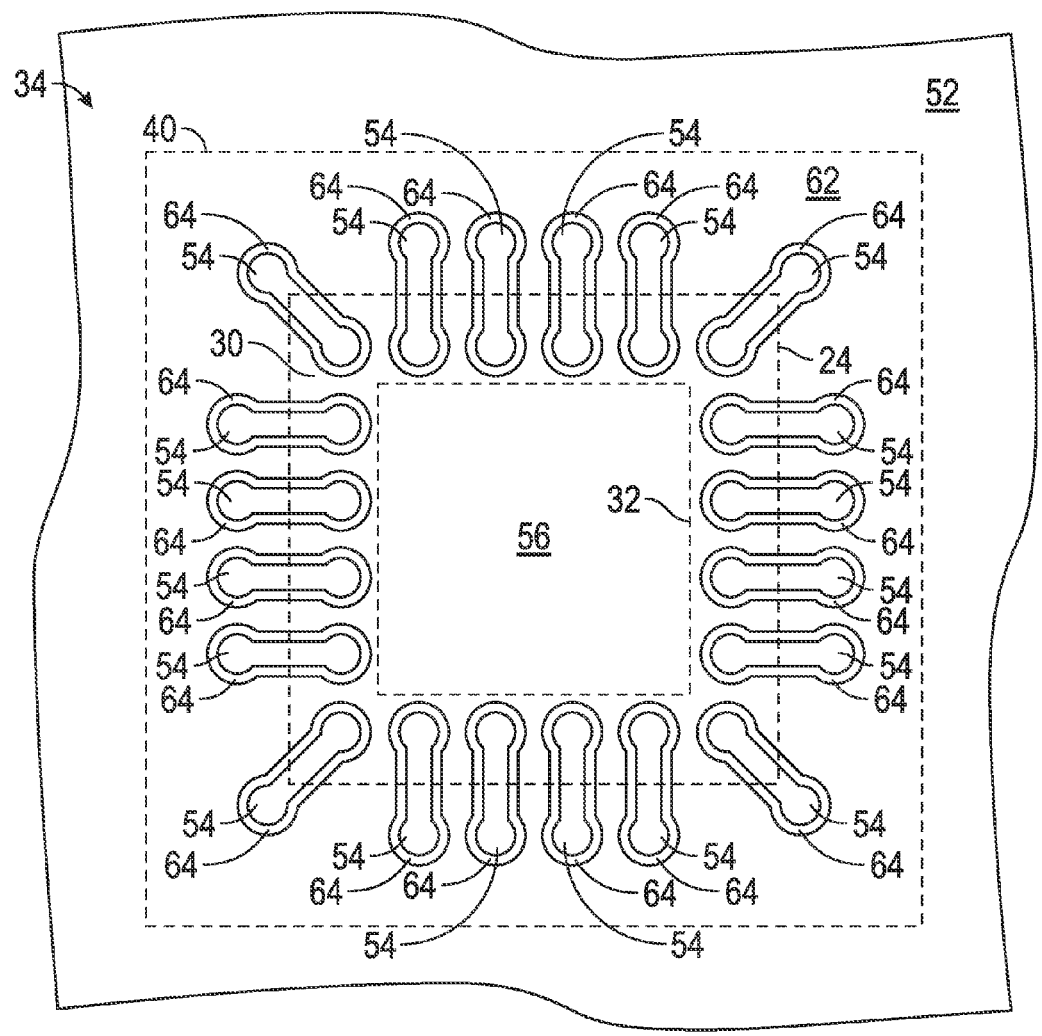

Next, at STEP 44 of exemplary method 20 (FIG. 1), one or more build-up or Redistribution layers (RDL layers) are produced over frontside 42 of RCP panel 34 and die 24 embedded therein. FIGS. 4 and 5 are cross-sectional views taken through a portion of the RCP panel 34 containing a single semiconductor die 24 (demarcated in FIG. 3 by dashed box 46), which illustrate one manner in which a number of RDL layers 48 may be formed over RCP panel 34. Hereafter, the following description and the accompanying figures will primarily focus on the processing of the portion of RCP panel 34 shown in FIGS. 4 and 5 corresponding to a single RCP package produced pursuant to singulation RCP panel 34, as described below in conjunction with STEP 76 of exemplary method 20 (FIG. 1). A first embodiment of the RCP package will now be described in conjunction with FIGS. 4-9 wherein the RCP package (shown in a partially-completed state in FIGS. 4-8 and in a completed state in FIG. 9) is identified by reference numeral "40." While the following description primary describes the processing of a relatively small region of RCP panel 34 corresponding to RCP package 40, it should be understood that below-described process steps will typically be performed across the entire RCP panel 34 and for all die 24 (FIG. 3) to yield a plurality of completed RCP packages upon completion of method 20 (FIG. 1).

During build-up of RDL layers 48 (STEP 44, FIG. 1), a first dielectric layer 50 may be spun-on or otherwise deposited over frontside 42 of RCP panel 34 (FIG. 3) including over the frontside of partially-fabricated RCP package 40 shown in FIG. 4. Dielectric layer 50 is then lithographically patterned to expose the bond pads and at least a portion of the non-bond pad areas of semiconductor die 24 embedded within RCP panel 34. Afterwards, a metal layer (commonly referred to as the "M1 metal layer") is deposited over the patterned dielectric layer and lithographically patterned to define a number of interconnect lines within the RDL layers, as well as a thermally-conductive base layer (e.g., base layer 56 described below) and perhaps a peripheral heat sink body (e.g., peripheral heat sink body 62 described below). With respect to the partially-fabricated RCP package 40 shown in FIG. 4, specifically, it can be seen that patterning of dielectric layer 50 has formed openings exposing bond pads 28 and the majority of frontside non-die pad area 32. As further shown in FIG. 4, a metal (e.g., copper) layer 52 has further been deposited over the patterned dielectric layer 50 and into the openings created therein. Metal layer 52 is further lithographically patterned to define a plurality of interconnect lines 54 in ohmic contact with bond pads 28. In this simplified example, RDL layers 48 include only a singe metal layer or metal level defining interconnect lines 54; however, it will be readily appreciated that RCP package 40 (and the other RCP packages produced by singulation of panel 34) can be fabricated to include any practical number of (e.g., up to five or more) metal levels in further embodiments.

With continued reference to FIG. 4, patterning of M1 metal layer 52 also defines a thermally-conductive base layer 56, which extends over a portion and, preferably, over the majority of frontside non-bond pad area 32 of semiconductor die 24. Stated differently, base layer 56 is formed along with interconnect lines 54 via the deposition and patterning of M1 metal layer 52. Thermally-conductive base layer 56 is thus composed of a deposited metal, such as copper, which has been deposited directly onto frontside non-bond pad area 32 of semiconductor die 24. Electrical isolation between base layer 56 and the circuitry of semiconductor die 24 may be provided by a non-illustrated passivation layer or other intervening dielectric layer previously formed over the upper surface of die 24. Patterning of metal layer 52 has created openings or air gaps electrically isolating thermally-conductive base layer 56 from the surrounding interconnect lines 54. An additional dielectric layer 58 may now be spun-on or otherwise deposited over patterned metal layer 52 to fill the openings between base layer 56 and interconnect lines 54. Dielectric layer 58 may then be lithographically patterned to create additional openings therein exposing selected portions of interconnect lines 54, as well as some or all of thermally-conducive base layer 56; e.g., a relatively large central opening 60 may be formed in dielectric layer 58 to expose base layer 56 in its substantial entirety. The structure shown in FIG. 5 results. In the illustrated example, dielectric layer 58 is uppermost dielectric included within RDL layers 48 and may consequently be considered a capping or passivation layer. In other embodiments, additional electrically-conductive and dielectric layers may be deposited over dielectric layer 58 and patterned to satisfy more complex package routing requirements, as needed.

As will be described more fully below, for each RCP package produced pursuant to method 20 (FIG. 1), a primary heat sink body is deposited or positioned over non-bond pad area 32 of semiconductor die 24 (FIG. 2) to provide a highly efficient and direct frontside heat dissipation path improving the overall thermal performance of the RCP package. Still further improvements in the heat rejection capabilities of the microelectronic packages can be brought about in at least two ways. First, it is possible to fabricate the microelectronic packages to each include a backside heat sink structure, such as a backside metal (e.g., copper slug) of the type described in the foregoing section entitled "BACKGROUND," in addition to the primary heat sink body embedded within the frontside of the RCP package. Second, each microelectronic packages can be produced to include at least one peripheral heat sink body in addition to the primary heat sink body. In this case, the peripheral heat sink body can be discretely-fabricated, thermally-conductive structure, such as annular or ring-shaped metal (e.g., copper) slug, which is positioned over an outer peripheral portion of fan-out area of the molded bodies created via singulation of RCP panel 34 (FIG. 3). Alternatively, the peripheral heat sink body may comprise a deposited (e.g., plated) metal body of the type described below in conjunction with FIGS. 4 and 5.

In the exemplary embodiment shown in FIGS. 4 and 5, a peripheral heat sink body 62 has been formed in conjunction with deposition and patterning of M1 metal layer 52. Here, peripheral heat sink body 62 assumes the form of a deposited metal (e.g., copper) ring, which circumscribes interconnect lines 54 and the external contacts (e.g., solder balls) later formed over the topside of RCP package 40. Peripheral heat sink body 62 is formed over RCP fan-out region 63 of RCP panel 34 surrounding semiconductor die 24. As is thermally-conductive base layer 56, peripheral heat sink body 62 is electrically isolated from interconnect lines 54 by patterning and etching away the metal surrounding lines 54 to create a circumferential gap therearound, which is then filled with dielectric during deposition of dielectric layer 58. This may be more fully appreciated by referring to FIG. 6, which is a top-down view of a portion of RCP panel 34 prior to deposition of dielectric layer 58 wherein the outline of partially-completed RCP package 40, semiconductor die 24, and non-bond pad area 32 are shown in phantom. In certain embodiments, peripheral heat sink body 62 may extend to the saw lanes of RCP panel 34 (FIG. 3) such that heat sink body 62 is exposed through one or more sidewalls of RCP package 40 after singulation of RCP panel 34, as described below in conjunction with STEP 76 of exemplary method 20 (FIG. 1).

Continuing onward to STEP 66 of exemplary method 20 (FIG. 1), primary heat sink bodies are next provided in central openings 60 through which base layer 56 is exposed. The primary heat sink bodies may be discretely-fabricated, thermally-conductive structures, such as metal (e.g., copper) slugs, which are adhered or otherwise attached to thermally-conductive base layer 56 in the manner described below in conjunction with FIGS. 14-16. Alternatively, the primary heat sink bodies may be formed by depositing a relatively thick layer of thermally-conductive material over non-bond pad area 32 of semiconductor die 24 and onto thermally-conductive base layer 56; and, preferably, by plating a relatively thick layer of copper or other metal directly onto base layer 56. An example of one manner in which a primary heat sink body may be formed over thermally-conductive base layer 56 and in opening 60 of RCP package 40 (FIGS. 4-6) is described below in conjunction with FIGS. 7-9.

FIGS. 7-9 illustrate one manner in which a layer of metal can be plated or otherwise deposited on thermally-conductive base layer 56 to produce a primary heat sink body in thermal contact with frontside non-bond pad area 32 of semiconductor die 24. Referring initially to FIG. 7, a masking layer 68 (partially shown) may first be formed over partially-completed RCP package 40 and the other partially-completed RCP packages included within RCP panel 34 (FIG. 3). Openings are provided in the masking layer, which align with openings formed through dielectric layer 58, such as central opening 60 shown in FIG. 7. In one embodiment, masking layer 68 is a layer of photoresist, which is lithographically patterned to create an opening therein aligning with opening 60. Next, a plating process is carried-out to form primary heat sink bodies in the openings provided through masking layer 68. Referring to the portion of RCP panel 34 (FIG. 3) shown in FIG. 8 corresponding to partially-completed RCP package 40, plating may result in the production of a primary heat sink body 70 within central opening 60. Primary heat sink body 70 may thus be composed of, and preferably consists essentially, of copper or another metal plated directly onto electrically-conducive base layer 56. In the illustrated example, primary heat sink body 70 has a generally rectangular or square-shaped planform geometry; however, heat sink body 70 can be formed to have any desired planform shape, including circular and ovular shapes, in alternative embodiments.

Primary heat sink body 70 may be plated to have a height or thickness substantially equivalent to the thickness of RDL layers 48 such the upper surface of heat sink body 70 is substantially flush or planar with respect to the upper surface of RDL layers 48. Alternatively, primary heat sink body 70 may be plated to have a thickness greater than or less than that of RDL layers 48. Generally, primary heat sink body 70 may be deposited to have a thickness between about 20 and about 300 microns (m); although body 70 may be thicker or thinner in further embodiments. As a more specific example, in a first embodiment, primary heat sink body 70 may be deposited to a thickness between about 20 and about 100 µm in instances wherein physical contact is not desired between heat sink body 70 and the printed circuit board (or other platform) to which RCP package 40 is mounted. In a second embodiment, primary heat sink body 70 may be deposited to a thickness sufficient to bring the upper surface of body 70 to a level or elevation substantially equal to that of the solder balls or other external contacts of RCP package 40 (e.g., a thickness between about 100 and 300 µm) in instances wherein physical contact is desired between heat sink body 70 and the printed circuit board (or other platform) to which RCP package 40 is mounted.

After formation of primary heat sink body 70, masking layer 68 may be stripped or otherwise removed and a contact array may be formed over the frontside of partially-completed RCP package 40 and the other packages included within RCP panel 34 (STEP 72, FIG. 1). The contact array preferably comprises a number of solder balls deposited in a Ball Grid Array (BGA) or a number of printed contacts formed from an electrically-conductive paste; however, the contact array may assume any form suitable for providing externally-exposed points-of-contact to the interconnect lines within the RDL layers, such as externally-exposed bond pads in ohmic contact with the RDL interconnect lines or portions of the RDL interconnect lines exposed through the uppermost RDL dielectric layer. RDL layers 48 and, specifically, interconnect lines 54 electrically couple the bond pads 28 of embedded semiconductor die 24 to the externally-exposed contacts of the contact array. After formation of the contact array, RCP panel 34 may be singulated (STEP 76, FIG. 1) to yield a number of completed RCP packages each containing an embedded semiconductor die 24. In this regard, FIG. 9 illustrates RCP package 40 after contact array formation (e.g., ball attach or bumping) and panel singulation defining the sidewalls of a discrete molded body 80 in which semiconductor die 24 is embedded. During bumping, upper dielectric layer 58 is patterned to create a number of interconnect line-exposing trenches or openings therein. A plurality of solder balls 74 is then deposited over the topside of RCP package 40 and in ohmic contact with the exposed portions of interconnect lines 54. Solder balls 74 may be coplanar in level or elevation with the upper surface of primary heat sink body 70, as taken along an axis substantially orthogonal to the upper surface of encapsulated die 24 (identified as the Z-axis by coordinate legend 75 in FIG. 9). Singulation has also resulted in the exposure of peripheral heat sink body 62 through the sidewalls of the completed RCP package 40. Singulation of RCP panel 34 (FIG. 3) is conveniently carried-out by mechanical sawing; however, other dicing processes may also be employed, such as laser cutting or scribe and break.

With the completion of RCP package fabrication method 20 (FIG. 1), a number of RCP packages have now been produced each including at least one frontside thermal contact. In the above-described example, and with continued reference to FIG. 9, the frontside thermal contact assumes the form of primary heat sink body 70, which is at least partially embedded within RDL layers 48, formed over non-die pad area 32 of embedded die 24, and exposed through the frontside of RCP package 40. In the foregoing example, heat sink body 70 assumes the form of a relatively thick plated metal layer, which is deposited directly on an intervening thermally-conductive base layer 56 provided over encapsulated semiconductor die 24. As a result of this structural configuration, a highly efficient thermal conduction path is provided through RCP package 40 from the frontside of semiconductor die 24 (where heat generation primarily occurs), through base layer 56, through primary heat sink body 70, and to the exterior of RCP package 40. All structures or layers making-up this dedicated frontside heat dissipation path are formed from metal (or at least contain metal as a primary constituent) and are consequently highly thermally conductive; e.g., in a preferred embodiment wherein base layer 56 and heat sink body 70 both comprise a deposited metal (e.g., copper), a highly conductive, robust, and direct (non-tortuous) thermal path is provided from die 24 to the frontside exterior of the package consisting essentially of the deposited metal. The thermal performance of RCP package 40 is improved as a result.

In the exemplary embodiment described above in conjunction with FIGS. 1-9, RCP package 40 includes a single, ring-shaped peripheral heat sink body 62, which cooperates with primary heat sink body 70 to provide substantially even heat dissipation across the entire frontside surface of RCP package 40. In the above-described example, peripheral heat sink body 62 is formed by deposition and patterning of metal layer 52 along with thermally-conductive base layer 56 and interconnect lines 54. As a result, the thickness of peripheral head sink body 62 is substantially equivalent to the thickness of base layer 56 and interconnect lines 54. While heat sink body 62 is exposed through the sidewalls of the completed RCP package 40, the upper surface peripheral heat sink body 62 is overlaid or covered by upper dielectric layer 58 (shown most clearly in FIG. 9). In further embodiments, peripheral heat sink body 62 can be produced to have an increased thickness and/or to be exposed through the uppermost or topside surface of RCP package 40 for improved heat dissipation. An example of a fabrication process suitable for producing such an RCP package with such a peripheral heat sink body will now be described below in conjunction with FIGS. 10-13.

FIGS. 10-13 illustrate an alternative fabrication process performed in accordance with exemplary method 20 (FIG. 1) suitable for producing a number of RCP packages 82 having peripheral heat sink bodies with enhanced heat rejection capacities as compared to heat sink body 62 shown in FIGS. 4-9. Like reference numerals have been utilized to denote like structural elements in FIGS. 10-13. Referring initially to FIG. 10, a partially-completed RCP package 82 is initially produced having structural features similar to those described above in conjunction with RCP package 40 at the stage of manufacture shown in FIG. 4. However, in contrast to dielectric layer 50 shown in FIG. 4, a dielectric layer 84 has been deposited over frontside 42 of RCP panel 34 and patterned to expose not only bond pads 28 and non-bond pad area 32 of semiconductor die 24, but also an outer peripheral portion of fan-out region 63 of the molded body in which semiconductor die 24 is embedded (the molded body identified in FIG. 13 and in all figures illustrating the RCP packages after panel singulation by reference numeral "80"). A metal layer 84 is then deposited over partially-completed RCP package 82 and lithographically patterned to produce a thermally-conductive peripheral base layer 88 in addition to interconnect lines 54 and central base layer 56. As shown in FIG. 11, a masking layer 90 may then be deposited over RCP package 82 and lithographically patterned to create openings exposing base layers 56 and 84. Plating may then be performed in the above-described manner to produce primary heat sink body 70, as well as a relatively thick peripheral heat sink body 92 (shown in FIG. 12). A BGA 74 or other contact array may then be produced over RCP package 82, and panel singulation performed. The resultant structure is shown in FIG. 13 wherein the plated peripheral heat sink body 92 includes both top and sidewall surfaces exposed from the exterior of RCP package 82.

In the above-described exemplary embodiments, the primary heat sink body was provided by plating a relatively thick metal layer over thermally-conductive base layer 56. It is emphasized, however, the primary heat sink body can be provided in any manner suitable for forming, disposing, or otherwise providing a thermally-conductive body in thermal communication with semiconductor die 24. For example, in further embodiments, the primary heat sink body may be provided in the form of a discretely-fabricated, thermally-conductive structure, such as metal (e.g., copper) slug. In this case, the metal slug may be adhered or otherwise attached to thermally-conductive base layer 56 in the manner described below in conjunction with FIGS. 14 and 15; or, in embodiments wherein the RCP package does not include base layer 56, the metal slug may be attached directly frontside non-bond pad area 32 of die 24, as described below in conjunction with FIG. 16.

FIGS. 14 and 15 illustrate a further embodiment of exemplary method 20 (FIG. 1) wherein the primary heat sink body assumes the form of a metal slug, which is attached to thermally-conductive base layer 56. Referring initially to FIG. 14, there is shown a version of the partially-completed RCP package (identified by reference numeral "94") wherein a plating process has not been performed to build a primary heat sink body over thermally-conductive base layer 56. As a result, base layer 56 remains exposed through opening 60 provided in dielectric layer 58. With reference to FIG. 15, a discretely-fabricated primary heat sink body 96 may thus be positioned within opening 60 and attached to the exposed region of base layer 56. In a preferred embodiment, primary heat sink body 96 assumes the form of a metal (e.g., copper) slug having planform dimensions slightly less than the planform dimensions of opening 60. Primary heat sink body 96 may be attached to base layer 56 utilizing, for example, a layer of thermally-conductive adhesive 98, such as a metal-containing (e.g., a silver- or copper-filled) epoxy. BGA 74 or another contact array may be formed either before or after attachment of primary heat sink body 96. As indicated in FIG. 15, primary heat sink body 96 may have a height greater than the thickness of RDL layers 48 and, perhaps, a height sufficient to bring the uppermost surface of body 96 substantially even or level with solder balls 74. Alternatively, as indicated in FIG. 16 wherein the completed RCP package is identified by reference numeral "100," thermally-conductive base layer 56 may not be formed over of encapsulated semiconductor die 24 during fabrication of the RCP package; and primary heat sink body 96 may be attached directly to frontside non-bond pad area 56 of die 24.

Figure 17:
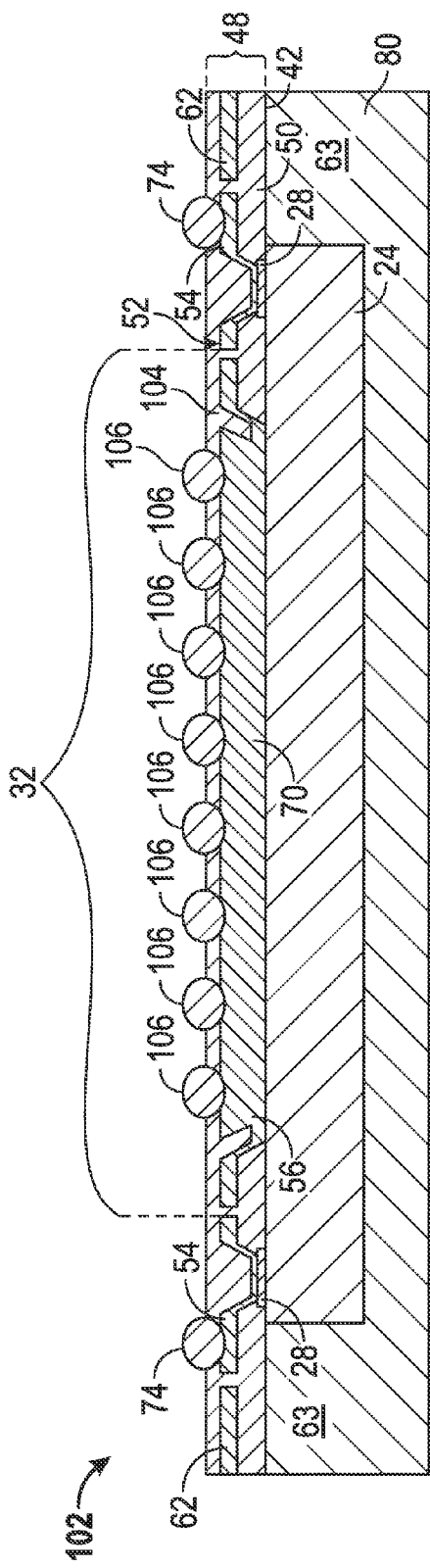

In the foregoing embodiments, the primary heat sink body was exposed through the frontside of the RCP package; however, this need not always be the case. Instead, in certain embodiments, the primary heat sink body may be covered by one or more overlying layers, such as an overlying capping or passivation layer. In such embodiments, it may still be desirable to provide a direct thermal path from the encapsulated die, through the covered heat sink body, and to one or more thermal contacts exposed through the frontside of the RCP package. This may be accomplished via the deposition of bodies of a thermally-conductive material, such as solder balls, which extend through the overlying dielectric layer to the covered heat sink body. For example, as shown in FIG. 17, an RCP package 102 can be produced including an upper dielectric layer 104 that is deposited or otherwise formed over primary heat sink body 70. Upper dielectric layer 104 may be lithographically patterned to expose selected regions of heat sink body 70; and, during bumping, a plurality of solder balls 106 can be deposited onto heat sink body 70 to provide a number of thermally-conductive paths from the buried heat sink body 70 to the exterior of RCP package 102.

Figure 18:
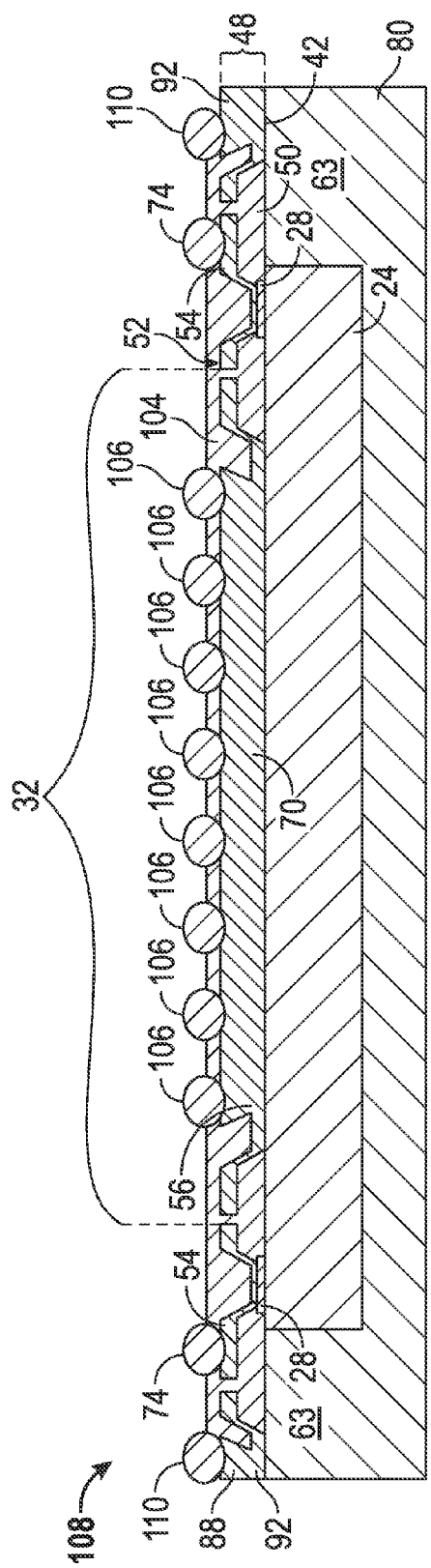

Notably, in contrast to solder balls 74, solder balls 106 RCP package 102 (FIG. 17) are electrically-inactive; that is, electrical current is not routed through solder balls 106 during operation of embedded die 24. In such embodiments, electrically-inactive solder balls 106 provide the externally-exposed frontside contacts of RCP package 102; and, along with buried heat sink body 70 and thermally-conductive base layer 56 (if provided), provide a direct and efficient thermal conduction path from the frontside of die 24 to the exterior of RCP package 102. Additionally, due to their general spherical or globular shape, solder balls 106 may collectively provide an increased cumulative surface area for removing heat from RCP package 102 by convective and/or conductive cooling. It should also be noted that electrically-inactive solder balls (or similar electrically-conductive bodies) can be formed in contact with the peripheral heat sink body, if included in the RCP package. For example, as shown in FIG. 18, an RCP package 108 can be produced that further includes a plurality of electrically-inactive solder balls 110 (or other such thermally-conductive, electrically-inactive contacts), which physically contact and thus conductively remove heat from peripheral heat sink body 88 during operation of semiconductor die 24. In this manner, efficient heat dissipation can be provided across the entire frontside surface of RCP package 110 in a substantially uniform manner.

The foregoing has thus provided multiple embodiments of a fabrication method for producing number of microelectronic or RCP packages having frontside thermal contacts, which provide efficient heat dissipation paths through the packages to increase the thermal performance thereof. In the above-described exemplary embodiments, the RCP packages were produced to include at least one primary heat sink body formed over a frontside non-bond pad area of semiconductor die embedded within the package. The primary heat sink body may be at least partially embedded within the RDL layers of the RCP package and, in preferred embodiments, is circumscribed thereby and by the contact array formed over the package topside. In preferred embodiments, the RCP package includes one or more thermal contacts exposed through the frontside of the package. The thermal contact or contacts may be the primary heat sink body itself when exposed through the package frontside; or, alternatively, solder balls or other thermally-conductive bodies formed in contact with the primary heat sink when covered by one or more dielectric layers. When mounted to a printed circuit board or other substrate, the primary heat sink body can be positioned and sized to contact another thermally-conductive member disposed on the substrate to further remove heat from the RCP package through conductive heat transfer. Additionally or alternatively, the primary heat sink body may be positioned so as to be convectively cooled by a cooling fluid (e.g., ambient air or forced airflow) when mounted within a larger system.

While the above-described RCP packages were primary described above as including external contacts in the form of BGA solder balls, it is emphasized that the RCP package can be produced to include other types of external electrical contacts in alternative embodiments, such as printed contacts. Similarly, a solder ball print process can be utilized in place of the solder ball finish described above in conjunction with FIGS. 17 and 18 to produce electrically-inactive, thermally-conductive contacts in contact with the buried heat sink body 70, while imparting the RCP package with a substantially flat or planar upper surface. Additionally, in some embodiments, it may be desirable to form multiple openings, parallel trenches, a lattice pattern, or the like in heat sink body 70, which may or may not extend through body 70 and divide body 70 into multiple spaced-apart regions or portions, to help accommodate disparities in thermal growth that may occur due to differences in coefficients of thermal expansion between primary heat sink body 70, semiconductor die 24, and the other components of the completed RCP package.

In one embodiment, the above-described fabrication method includes the step or process of forming one or more RDL over an encapsulated die having a frontside bond pad area and a frontside non-bond pad area, which is preferably passivated or otherwise electrically-insulated. The RDL layers are formed to have a frontside opening over the non-bond pad area of the encapsulated die. A primary heat sink body is provided in the frontside opening in thermal contact or communication with the encapsulated die. A contact array is formed over the RDL layers and is electrically coupled to a plurality bond pads located on the frontside bond pad area of the encapsulated die. If desired, the primary heat sink body or thermal contact to frontside non-bond pad area can be separated into multiple small sections to make-up a segregated thermal platform area reducing stress within the RCP package. Additionally, one or more thermal platforms or heat sink bodies can also be selectively provided at specific heat zone areas of the semiconductor die.

In another embodiment, the fabrication method includes encapsulating a plurality of semiconductor die within a RCP panel wherein each semiconductor die comprising a frontside surface having a central non-bond pad area around which a plurality of bond pads has been formed. One or more RDL layers are formed over the RCP panel and having frontside openings through which the central non-pad areas of the encapsulated die are at least partially exposed. Primary heat sink bodies are provided in the frontside openings in thermal contact with the encapsulated semiconductor die. A contact array is deposited over the RDL layers. The contact array is electrically coupled to a plurality bond pads located on the frontside bond pad area of the encapsulated die through the RDL layers. The RCP panel is then singulated to yield a plurality of microelectronic packages each having a frontside heat dissipation path extending from the encapsulated semiconductor die, through the primary heat sink body, and to the exterior of the microelectronic package.

The foregoing has also provided embodiments of microelectronic or RCP packages. In one embodiment, the microelectronic package includes a semiconductor die, which has a frontside non-bond pad area and a frontside bond pad area. A plurality of bond pads is formed over the semiconductor die and located within the frontside bond pad area. The microelectronic package further includes a molded body in which the semiconductor die is embedded; one or more redistribution layers formed over the semiconductor die; and a contact array formed over the one or more redistribution layers and electrically coupled to the plurality of bond pads therethrough. A primary heat sink body thermal contacts the semiconductor die and is disposed over the frontside non-bond pad area thereof. The microelectronic package may be an RCP package, in which case the molded body may be comprised of a singulated piece of a molded RCP panel; that is, a panel comprising a molded body formed over a plurality of semiconductor die or other microelectronic devices placed on a taped mold frame or other temporary substrate, over the frontside of which one or more RDL layers and a contact array are formed, and which may be subsequently singulated to produce a number of RCP packages each containing at least one embedded microelectronic device surrounded by a molded body having a fan-out area over which at least a portion of the RDL layers and the contact array are located. The primary heat sink body may be generally centered with respect to the semiconductor die, at taken along an axis substantially orthogonal to the frontside surface of the semiconductor die; and the one or more redistribution layers may circumscribe the primary heat sink body. In still further embodiments wherein the molded body includes a fan-out region surrounding the semiconductor die, the microelectronic package may further include a peripheral heat sink body formed over the fan-out region and in thermal contact with the primary heat sink body.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It being understood that various changes may be made in the function and arrangement of elements described in an exemplary embodiment without departing from the scope of the invention as set-forth in the appended claims.

What is claimed is:

1. A method for producing a microelectronic package, comprising:
   forming one or more redistribution layers over an encapsulated die around which a molded body having a fan-out area is formed, the encapsulated die having a frontside bond pad area and a frontside non-bond pad area, the redistribution layers formed to have a frontside opening over the non-bond pad area of the encapsulated die;
   providing a primary heat sink body in the frontside opening and thermally coupled to the encapsulated die;
   forming a contact array over the redistribution layers and electrically coupled to a plurality bond pads located on the frontside bond pad area of the encapsulated die; and
   providing a peripheral heat sink body over the fan-out area, electrically-isolated from a plurality of interconnected lines formed within the redistribution layers, and in thermal contact with the primary heat sink body.

2. The method of claim 1 wherein the frontside opening is formed within a central region of the redistribution layers, and wherein the primary heat sink body is positioned over a central region of the encapsulated die.

3. The method of claim 1 wherein the contact array is disposed around the primary heat sink body.

4. The method of claim 1 wherein providing comprises adhesively attaching a metal slug directly to the frontside non-bond pad area of the encapsulated die.

5. The method of claim 1 wherein the primary heat sink body is exposed through the frontside of the microelectronic package.

6. The method of claim 1 wherein providing a peripheral heat sink body comprises forming a thermally-conductive layer over the fan-out area utilizing the lithographical patterning and metal deposition processes used to form the redistribution layers.

7. The method of claim 1 wherein the thermally-conductive layer has a substantially ring-shaped planform geometry and extends around the contact array.

8. The method of claim 1 wherein the primary heat sink body has planform dimensions less than the planform dimensions of the encapsulated semiconductor die.

9. The method of claim 1 further comprising depositing a thermally-conductive base layer directly onto the frontside non-bond pad area of the encapsulated die.

10. The method of claim 9 wherein providing the primary heat sink body comprises plating at least one layer of metal in the frontside opening and on the thermally-conductive base layer to produce the primary heat sink body.

11. The method of claim 9 wherein providing comprises attaching a metal slug to the thermally-conductive base layer.

12. The method of claim 1 further comprising:
   forming a dielectric layer over the primary heat sink body; and
   forming thermally-conductive contacts extending through the dielectric layer and contacting the primary heat sink body.

13. The method of claim 12 wherein the thermally-conductive contacts comprise solder balls.

14. The method of claim 1 wherein the forming comprises forming the redistribution layers over the encapsulated die while included within a molded panel containing a plurality of other encapsulated die, and wherein the method further comprises singulating the molded panel to define the sidewalls of the microelectronic package.

15. The method of claim 14 further comprising forming a peripheral heat sink body in thermal contact with the primary heat sink body along an outer perimeter of the microelectronic package such that the peripheral heat sink body is exposed through at least one sidewall of the microelectronic package after singulation of the molded panel.

16. A microelectronic package, comprising:
   a semiconductor die having a frontside non-bond pad area and a frontside bond pad area;
   a plurality of bond pads located over the semiconductor die and located within the frontside bond pad area;
   a molded body in which the semiconductor die is embedded;
   one or more redistribution layers located over the semiconductor die;
   a contact array located over the one or more redistribution layers and electrically coupled to the plurality of bond pads therethrough; and
   wherein the microelectronic package is a Redistributed Chip Package (RCP), wherein the molded body is comprised of a singulated piece of a molded RCP panel, wherein the molded body comprises a fan-out region surrounding the semiconductor die, and wherein the microelectronic package further comprises a peripheral heat sink body located over the fan-out region.

17. The microelectronic package of claim 16 wherein the primary heat sink body is generally centered with respect to the semiconductor die, at taken along an axis substantially orthogonal to the frontside surface of the semiconductor die; and wherein one or more redistribution layers circumscribe the primary heat sink body.

18. The microelectronic package of claim 16 further comprising a primary heat sink body in thermal contact with the semiconductor die and with the peripheral heat sink body, the primary heat sink body disposed over the frontside non-bond pad area of the semiconductor die.

19. A method for producing a microelectronic package, comprising:
   forming one or more redistribution layers over an encapsulated die having a frontside bond pad area and a frontside non-bond pad area, the redistribution layers formed to have a frontside opening over the non-bond pad area of the encapsulated die;
   during formation of the one or more redistribution layers, plating a thermally-conductive base layer onto the frontside non-bond pad area of the encapsulated die;
   depositing a masking layer over the redistribution layers;
   forming an additional opening in the masking layer aligning with the frontside opening provided in the redistribution layers;
   after formation of the additional opening in the masking layer, plating at least one layer of metal in the frontside opening and onto the thermally-conductive base layer to produce a primary heat sink body in the frontside opening thermally coupled to the encapsulated die; and
   forming a contact array over the redistribution layers and electrically coupled to a plurality bond pads located on the frontside bond pad area of the encapsulated die.

20. The method of claim 19 further comprising:
   forming a dielectric layer extending over the primary heat sink body; and
   forming electrically-inactive solder balls extending through the dielectric layer and contacting the primary heat sink body, the electrically-inactive solder balls providing an increased cumulative surface area for removing heat from the microelectronic package through the primary heat sink body.

* * * * *